(12) United States Patent
Keates et al.

(10) Patent No.: US 9,871,273 B2
(45) Date of Patent: Jan. 16, 2018

(54) SURFACE MOUNT BATTERY AND PORTABLE ELECTRONIC DEVICE WITH INTEGRATED BATTERY CELL

(71) Applicant: Intel Corporation, Santa Clara, CA (US)

(72) Inventors: Andy Keates, Los Gatos, CA (US); Kannan Raja, Hillsboro, OR (US)

(73) Assignee: INTEL CORPORATION, Santa Clara, CA (US)

(*) Notice: Subject to any disclaimer, the term of this patent is extended or adjusted under 35 U.S.C. 154(b) by 193 days.

(21) Appl. No.: 14/574,913

(22) Filed: Dec. 18, 2014

(65) Prior Publication Data

US 2016/0181671 A1    Jun. 23, 2016

(51) Int. Cl.
*H01M 2/26* (2006.01)
*H01M 10/42* (2006.01)
(Continued)

(52) U.S. Cl.
CPC .......... *H01M 10/425* (2013.01); *H01M 2/26* (2013.01); *H01M 4/134* (2013.01); *H01M 10/0436* (2013.01); *H01M 10/0585* (2013.01); *H05K 1/0298* (2013.01); *H05K 1/16* (2013.01); *H05K 1/181* (2013.01); *H05K 3/10* (2013.01); *H01M 2/0202* (2013.01); *H01M 10/0562* (2013.01);
(Continued)

(58) Field of Classification Search
CPC .............. Y02E 60/122; H01M 10/052; H01M 10/0585; H01M 10/0565; H01M 10/0562; H01M 4/13; H01M 10/056; H01M 2220/30; H01M 2300/0094; H01M 10/4257; H01M 2300/0082; H01M 2/0212; H01M 2/1673; H01M 4/502; H01M 6/06; H01M 6/181; H01M 10/425; H01M 10/0436; H01M 4/134; H01M 2300/0065; H01M 2/0202; Y02T 10/7011; H01G 11/56; H01G 11/52; H01G 11/54; H01G 9/15; H05K 2201/10037; H05K 1/181; H05K 1/0298; H05K 3/10
USPC ....... 361/748, 760, 763, 764, 502, 523, 528, 361/532, 535, 538, 539, 540, 541; 429/162, 163, 304, 491, 492
See application file for complete search history.

(56) References Cited

U.S. PATENT DOCUMENTS

| | | | |
|---|---|---|---|
| 4,645,943 A * | 2/1987 | Smith, Jr. ................. | G06F 1/30 307/150 |
| 5,612,153 A | 3/1997 | Moulton et al. | |

(Continued)

FOREIGN PATENT DOCUMENTS

| TW | 200930201 | 7/2009 |
|---|---|---|
| TW | 201417637 | 5/2014 |

OTHER PUBLICATIONS

PCT/US2015/054602, International Search Report and Written Opinion, dated Jan. 22, 2016.

*Primary Examiner* — James Wu
(74) *Attorney, Agent, or Firm* — Stoel Rives LLP

(57) ABSTRACT

Systems and methods are provided for battery cells including solid electrolytes. Solid electrolyte cells may be integrated with electronic devices. For example, a solid electrolyte cell may be integrated with a metal surface of a circuit board or an electrically conductive surface of a chassis. Surface-mountable solid electrolyte cells may be electrically coupled to circuit traces using, for example, a reflow soldering process.

11 Claims, 6 Drawing Sheets

(51) Int. Cl.
*H01M 4/134* (2010.01)
*H01M 10/04* (2006.01)
*H01M 10/0585* (2010.01)
*H05K 1/02* (2006.01)
*H05K 1/18* (2006.01)
*H05K 3/10* (2006.01)
*H05K 1/16* (2006.01)
*H01M 2/02* (2006.01)
*H01M 10/0562* (2010.01)
*H01M 10/0565* (2010.01)

(52) U.S. Cl.
CPC .... *H01M 10/0565* (2013.01); *H01M 2220/30* (2013.01); *H01M 2300/0068* (2013.01); *H01M 2300/0082* (2013.01); *H05K 2201/10037* (2013.01)

(56) References Cited

U.S. PATENT DOCUMENTS

| | | | |
|---|---|---|---|
| 5,864,182 | A | 1/1999 | Matsuzaki |
| 6,118,651 | A * | 9/2000 | Mehrotra ............... H01G 9/00 361/504 |
| 7,622,226 | B2 | 11/2009 | Takahashi |
| 2003/0162100 | A1 | 8/2003 | Takahashi et al. |
| 2004/0258984 | A1 | 12/2004 | Ariel et al. |
| 2009/0183829 | A1* | 7/2009 | Rendek, Jr. ........... H05K 3/0014 156/285 |
| 2011/0117422 | A1* | 5/2011 | Lee ..................... H01M 10/052 429/163 |
| 2012/0234453 | A1 | 9/2012 | Pugh et al. |
| 2014/0076622 | A1 | 3/2014 | Neudecker et al. |
| 2014/0181551 | A1 | 6/2014 | Rahal-Arabi et al. |

\* cited by examiner

SURFACE MOUNT BATTERY AND PORTABLE ELECTRONIC DEVICE WITH INTEGRATED BATTERY CELL

TECHNICAL FIELD

This disclosure relates to surface mount batteries for electronic devices.

BACKGROUND

Electronic devices, including mobile platforms such as smartphones, laptops, notebook computers, and tablet computers, continue to shrink in size. A power delivery system, including one or more battery cells, is often among the largest components of a portable electronic device. As portable electronic devices shrink in size, users also expect that power delivery systems will grow smaller and more portable. Integration of batteries into physically small systems, and particularly thin systems, presents a challenge when plugs, sockets and even tabs are used to connect batteries to the systems.

BRIEF DESCRIPTION OF THE DRAWINGS

Arrangements and embodiments may be described in detail with reference to the following drawings, in which like reference numerals refer to like elements and wherein.

DETAILED DESCRIPTION OF EMBODIMENTS

Embodiments and arrangements disclosed herein use battery cells including solid electrolytes, such as solid polymers or ceramics. Unlike batteries with liquid electrolytes, batteries with solid polymer and/or ceramic electrolytes can withstand the high temperatures and durations of reflow solder processes that may be used for surface-mountable batteries and open new assembly options. Solid electrolyte cell batteries are also safer than liquid electrolyte cell batteries, as discussed below, since a flammable liquid electrolyte has the been a cause of catastrophic failures of common lithium-ion (Li-ion) batteries. Certain embodiments disclosed herein provide space savings, lower assembly costs, size reduction (e.g., in an X-Y plane), and/or height reduction (e.g., in a Z direction perpendicular to the X-Y plane). In addition, or in other embodiments, disclosed systems and methods may provide for direct integration of a battery in a system, removing much of the overhead of packaging and socket use. In certain embodiments, the solid electrolyte battery cells disclosed herein are rechargeable.

Figure 1A:
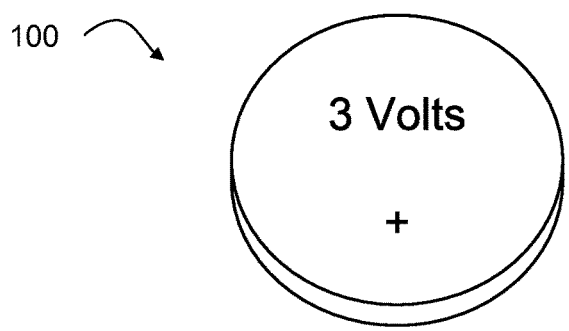
FIGS. 1A, 1B, and 1C, illustrate an example coin shape Li-ion battery that uses a liquid electrolyte.
Figure 1B:
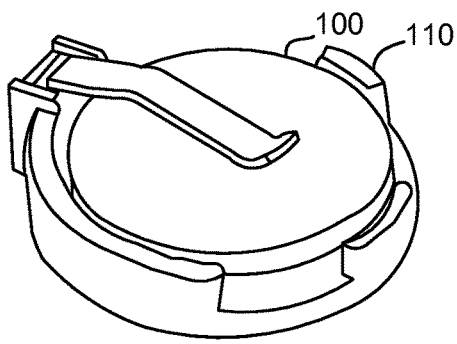
Figure 1C:
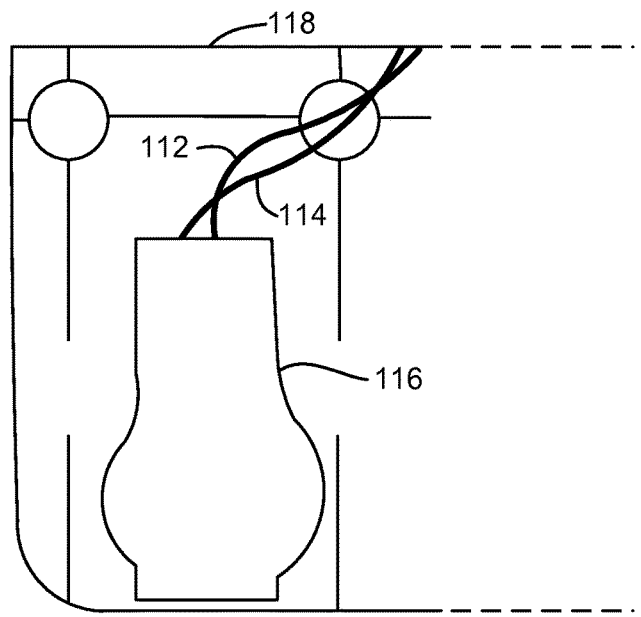

Small size batteries commercially available for surface mounting in handheld or portable electronic devices have a low capacity (e.g., liquid electrolyte cell batteries) or extremely low capacity (e.g., solid-state thin-film batteries). Small size secondary batteries have been used as power sources for memory backup of portable equipment such as cellular phones in recent years. For example, FIGS. 1A, 1B, and 1C, illustrate a coin shape Li-ion battery 100 that uses a liquid electrolyte and is packaged in a rigid, hermetically sealed metal "can" housing. The process of canning and hermetically sealing the coin shape Li-ion battery 100 may be costly and complex. Further, the can housing limits energy density, particularly in multi-cell packs where placing cylindrical cells side by side creates gaps of empty space. The coin shape Li-ion battery 100 may have a positive electrode including a lithium manganese composite oxide and a negative electrode including a lithium aluminum alloy and having a voltage of approximately 3V. As another example, a coin shape lithium secondary battery with a positive electrode including niobium pentoxide and a negative electrode including a lithium aluminum alloy and having a voltage of approximately 2.5 V has been used.

A problem with lithium batteries, such as that shown in FIG. 1A, is that liquid electrolyte is extremely flammable. Thus, soldering the coin shape Li-ion battery 100 to a circuit board may be dangerous. As one example of a reflow method, soldering is carried out by supplying solder between a circuit board and a terminal of a part, and then allowing the circuit board and the part to pass through a high temperature atmosphere. The soldering ensures an electrical contact between a circuit on the circuit board and the terminal of the part. The high temperature atmosphere may range, for example from about 220° C. to about 260° C., depending on the materials and processes used. Such conditions can cause high pressure to build within the can housing of the coin shape Li-ion battery 100 such that it either vents electrolyte or explodes. In a high temperature atmosphere, the electrolyte can flame as it is vented. Attempts to make the volatile liquid electrolyte less flammable to allow for surface-mount coin cells, have generally resulted in battery cells with very low capacities (e.g., up to about 2.5 mAh).

Thus, many applications avoid soldering Li-ion batteries with a liquid electrolyte to a circuit board. Rather, as shown in FIG. 1B, the coin shape Li-ion battery 100 may be placed in a holder 110 that has previously been soldered to a circuit board. The bulky holder 110 may add additional size and expense to the overall electronic device. In another example, as shown in FIG. 1C, the coin shape Li-ion battery 100 may be located remote from the circuit board and electrically connected thereto via wires 112, 114. Such implementations may add expense, for example, by manually soldering wires to the coin shape Li-ion battery 100, inserting the coin shape Li-ion battery 100 in a shrink wrap cover 116, applying heat to shrink the shrink wrap cover, soldering the other end of the wires 112, 114 to the circuit board, and gluing or otherwise attaching the shrink wrap cover 116 to a chassis 118 of the electronic device.

Figure 2:
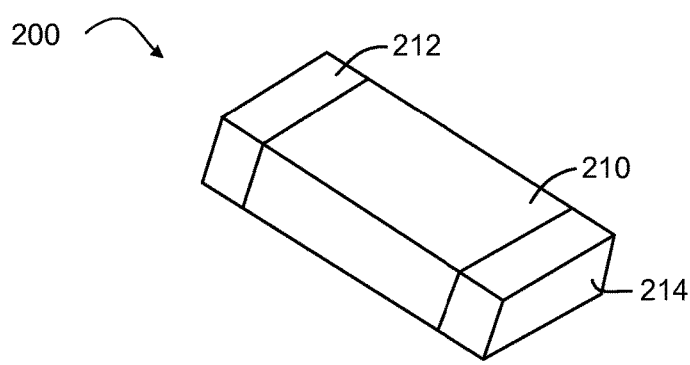
FIG. 2 is a perspective view of a battery cell including solid electrolytes according to one embodiment.

To avoid the problems with liquid electrolytes, certain embodiments disclosed herein use solid electrolytes. For example, FIG. 2 is a perspective view of a battery cell 200 including solid electrolytes 210 according to one embodiment. The solid electrolytes 210 may include a solid electrolyte cathode material electrically coupled to a first electrode 212 and a solid electrolyte anode material electrically coupled to a second electrode 214. The solid electrolyte cathode material and the solid electrolyte anode material may each include, for example, a solid polymer or ceramic material. The solid electrolyte anode material may comprise, for example, graphite, silicon, or a blend of graphite and silicon. The solid electrolyte cathode material may comprise, for example, a lithium metal oxide, such as lithium cobalt oxide (LCO) or nickel cobalt aluminum (NCA). Such materials may be used for any of the anodes and/or cathodes disclosed herein (i.e., not just for the embodiment shown in FIG. 2). Further a solid polymer separator or ceramic separator may separate the solid electrolyte cathode material from the solid electrolyte anode material, to prevent electrical short circuits and allow for the transport of ionic charge carriers during the passage of current in the battery cell 200. The first electrode 212 and the second electrode 214 are electrically conductive and include a material (e.g., copper, silver, or aluminum) that can be soldered to an electrically conductive trace on a printed circuit board or other substrate. In certain embodiments, a plastic or other laminate material may cover the solid electrolytes 210.

The battery cell 200 including the solid electrolytes 210 may be selectively sized, shaped, and configured for a particular surface mounting application. As shown in FIG. 2, the battery cell 200 may be rectangular, for example, to fit on a crowded circuit board. However, persons skilled in the art will recognize from the disclosure herein that the all-solid construction allows the battery cell 200 to have any rectangular or non-rectangular shape. Further, because there is no liquid that has to be contained by a hermetically sealed, rigid metal can, the height, width and length of the battery cell 200 can be selected to meet electrical storage capacity and space needs. Further, cost is reduced by avoiding the canning and sealing process, and the battery cell is safer that liquid electrolyte cells because the solid electrolytes 210 cannot leak or vent. The solid electrolytes 210 can also withstand extreme environmental conditions, such as the high temperatures associated with reflow soldering techniques.

Figure 3:
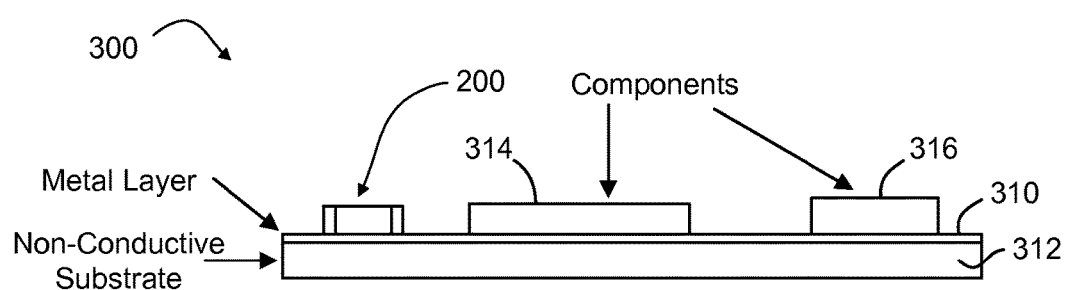
FIG. 3 is a side view of a circuit board assembly according to one embodiment.

FIG. 3 is a side view of a circuit board assembly 300 according to one embodiment. The circuit board assembly 300 includes a metal layer 310 over a non-conductive substrate 312. The metal layer 310 may include, for example, copper or other electrically conductive materials. Although not shown in FIG. 3, certain embodiments may include another metal layer below the non-conductive substrate 312 (e.g., used as a ground plane or power plane) connected to the top metal layer 310 through plated vias in the non-conductive substrate 312). The non-conductive substrate 312 may include, for example, fiberglass or non-conductive laminates.

During the manufacturing process, the metal layer 310 may be etched or otherwise formed to create a trace pattern for electrically connecting a plurality of circuit components 314, 316. The circuit components 314, 316 may include, for example, capacitors, resistors, transistors, and/or processors or other integrated circuits. As shown in FIG. 3, the battery cell 200 of FIG. 2 may be soldered onto the trace of the metal layer 310 along with the other circuit components 314, 316 of the circuit board assembly 300. Using automated processes (e.g., pick-and-place machines and/or reflow soldering) to populate the circuit board assembly 300 with the battery cell 200 along with the other components 314, 316 reduces manual labor and the overall cost of manufacturing the circuit board assembly 300.

Figure 4A:
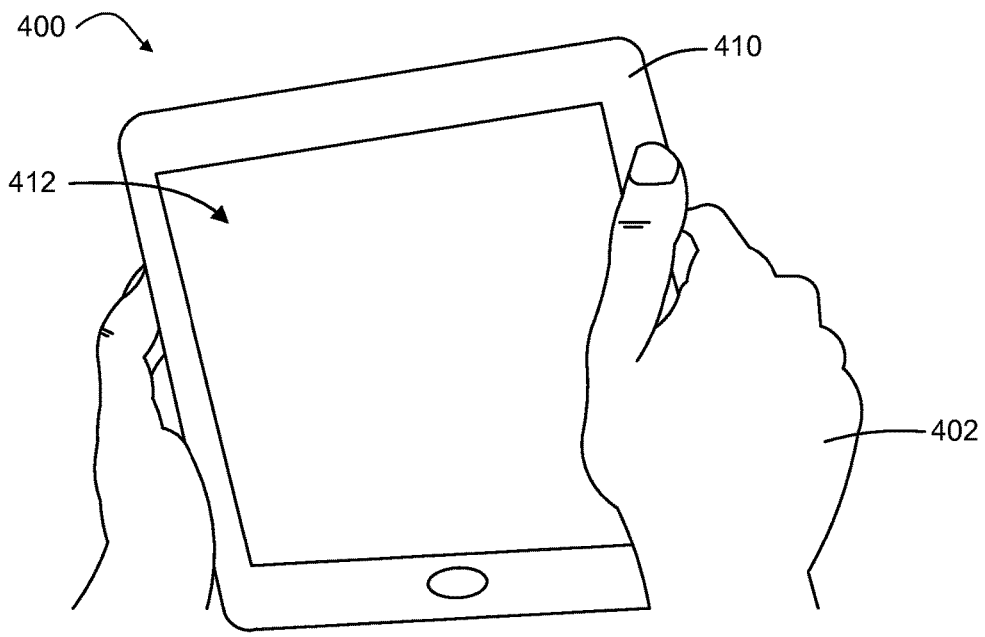
FIGS. 4A, 4B, 4C, and 4D illustrate a mobile electronic device including an integrated solid electrolyte battery according to one embodiment.

FIGS. 4A, 4B, 4C, and 4D illustrate a mobile electronic device 400 including an integrated solid electrolyte battery according to one embodiment. FIG. 4A shows a perspective view of the mobile electronic device 400 being handled by a user 402. In this example, the mobile electronic device 400 is a tablet computer. However, in other embodiments any mobile device may be used, such as a smartphone, a laptop computer, a notebook computer, a personal digital assistant (PDA), an audio and/or video player, a gaming device, a camera, a wearable device (e.g., an exercise or health monitor), or any other device using electrical power. As shown in FIG. 4A, the mobile electronic device 400 may include a chassis 410 for enclosing electronic circuitry and other components, and a display screen 412 to interface with the user 402. The display screen 412 may be a liquid crystal display (LCD) screen or other type of display screen, such as an organic light emitting diode (OLED) display. The display screen 412 can be configured as a touch screen. The touch screen may use capacitive, resistive, or another type of touch screen technology.

Those skilled in the art will also recognize from the disclosure herein that the mobile electronic device 400 may include a variety of additional components. For example, the mobile electronic device 400 may include one or more antennas configured to communicate with a transmission station, such as a base station (e.g., of a cellular network), a base band unit, a remote radio head, a remote radio equipment, a relay station, a radio equipment, or another type of wireless wide area network (WWAN) access point. As further examples, the mobile electronic device 400 may also include a microphone and one or more speakers that can be used for audio input and output from the mobile electronic device 400, an application processor (e.g., configured to perform the functions described herein), a graphics processor coupled to internal memory to provide processing and display capabilities, a non-volatile memory port to provide data input/output options to the 402 user and/or to expand the memory capabilities of the mobile electronic device 400, a keyboard (e.g., integrated with the mobile electronic device 400 or wirelessly connected to the mobile electronic device 400) to provide additional user input, and/or a virtual keyboard provided using the touch screen.

Figures 4B, 4C:
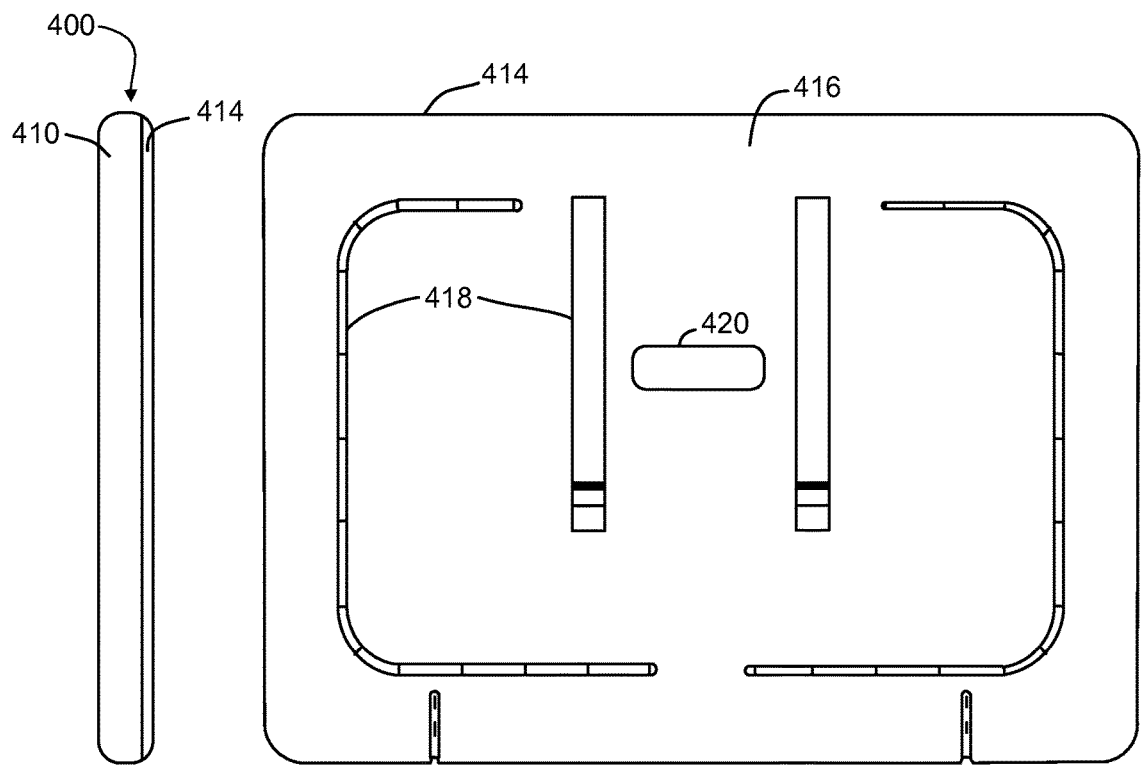

FIG. 4B illustrates a side view of the mobile electronic device 400. In this example, the chassis 410 of the mobile electronic device 400 includes a back plate 414. At least a portion of the back plate 414 is electrically conductive. For example, the back plate 414 may comprise aluminum. FIG. 4C illustrates an inside surface 416 of the back plate 414 (e.g., an internal surface of mobile electronic device 400 when assembled). The inside surface 416 may include structural elements 418 (e.g., strengthening ribs, walls or guides) to provide structural support to the chassis. However, as shown in FIG. 4C, the inside surface 416 of the back plate 414 may include large portions of open or unobstructed space. Thus, in this example embodiment, an unobstructed portion of the inside surface 416 of the back plate 414 is used as an electrode of an integrated solid electrolyte battery 420.

Figure 4D:
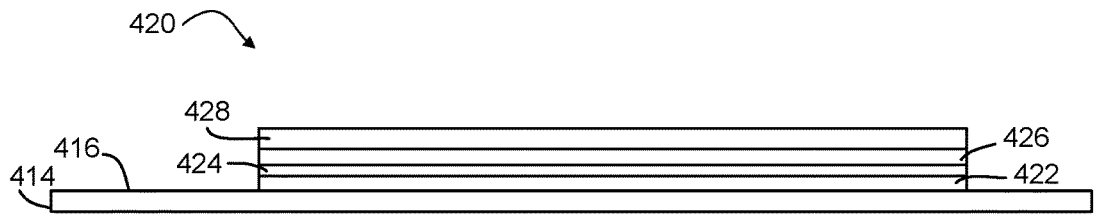

FIG. 4D illustrates a side view of the back plate 414 with the integrated solid electrolyte battery 420. In this example, the portion of the inside surface 416 that forms part of the integrated solid electrolyte battery 420 is flat. In other embodiments, however, the portion of the inside surface 416 and the integrated solid electrolyte battery 420 may be curved. In certain such embodiments, layers of the integrated solid electrolyte battery 420 comprise flexible sheet material that conform to the curvature of the inside surface 416 of the back plate 414.

In this example, a portion of the electrically conductive inside surface 416 of the back plate 414 forms a first electrode of the integrated solid electrolyte battery 420. For example, the back plate 414 may comprise the cathode current collector of the integrated solid electrolyte battery 420. In such an embodiment, the integrated solid electrolyte battery 420 includes a solid electrolyte cathode layer 422 over the portion of the inside surface 416 that forms the cathode current collector. The integrated solid electrolyte battery 420 further includes a separator layer 424 over the solid electrolyte cathode layer 422, a solid electrolyte anode layer 426 over the separator layer 424, and a second electrode 428 over the solid electrolyte anode layer 426.

In this example, the second electrode 428 is an anode current collector for the integrated solid electrolyte battery 420. In other embodiments, however, the layers of the integrated solid electrolyte battery 420 may be reversed such the first electrode (i.e., the back plate 414) forms the anode current collector and the second electrode 428 forms the cathode current collector. One or more of the layers 422, 424, 426, 428 may be applied from a roll of material, printed, sprayed, or otherwise deposited to form the integrated solid electrolyte battery 420. Thus, the integrated solid electrolyte battery 420 is part of the chassis. The height, width, and/or length of the integrated solid electrolyte battery 420 may be adjusted to fit a selected portion of the back plate 414 and/or to adjust the energy storage capacity of the integrated solid electrolyte battery 420. Electrical connections to the first electrode (i.e., the back plate 414) and the second electrode 428 provide power to circuitry and components of the mobile electronic device 400. Although not shown in FIG. 4D, certain embodiments of the integrated solid electrolyte battery 420 further include an encapsulation layer at least partially or fully covering the layers 422, 424, 426, 428 to provide protection from the environment. The encapsulation layer may include, for example, a plastic material or sealing compound.

Figure 5A:
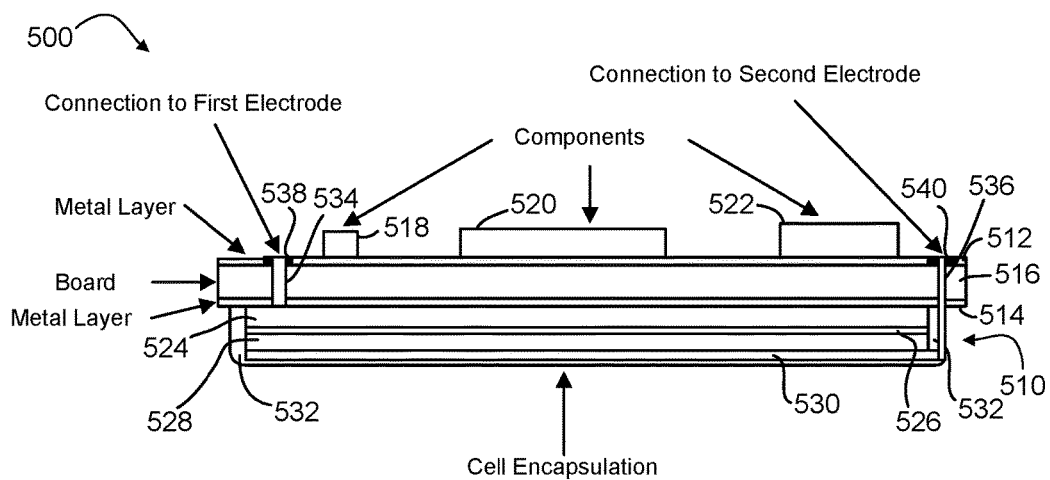
FIG. 5A is a cross-sectional side view of a circuit board including an integrated battery cell according to one embodiment and FIG. 5B is a cross-sectional side view of a circuit board including an integrated battery cell according to another embodiment.

In addition to being integrated with a chassis of an electronic device, or in other embodiments, a battery cell may be integrated with other components of an electronic device. For example, FIG. 5A is a cross-sectional side view of a circuit board 500 including an integrated battery cell 510 according to one embodiment. The circuit board 500 in this example is double sided. In other words, the circuit board 500 includes a first metal layer 512 and a second metal layer 514 separated by non-conductive substrate 516. The first metal layer 512 and the second metal layer 514 may include, for example, copper or other electrically conductive materials. The non-conductive substrate 516 may include, for example, fiberglass or non-conductive laminates.

As discussed above, the first metal layer 512 may be etched or otherwise formed to create a trace pattern for electrically connecting a plurality of circuit components 518, 520, 522. The circuit components 518, 520, 522 may include, for example, capacitors, resistors, transistors, and/or processors or other integrated circuits. One or more plated vias may be used to connect circuit traces 538, 540 of the first metal layer 512 to the electrically conductive plane of the second metal layer 514.

In this example, the second metal layer 514 of the circuit board 500 is used as first electrode of the battery cell 510. The battery cell 510 further includes a first solid electrolyte layer 524 underlying (i.e., adjacent to) the second metal layer 514, a separator layer 526 underlying the first solid electrolyte layer 524, a second solid electrolyte layer 528 underlying the separator layer 526, and a second electrode 530 underlying the second solid electrolyte layer 528. The first solid electrolyte layer 524 and the second solid electrolyte layer 528 may comprise a solid polymer or ceramic material. Further the separator layer 526 may comprise a solid polymer or ceramic configured to prevent electrical short circuits and allow for the transport of ionic charge carriers during the passage of current in the battery cell 510. The circuit board 500 may include a cell encapsulation layer 532 to isolate and/or protect the battery cell 510 (e.g., to keep moisture out). The encapsulation layer 532 may include a plastic material or sealing compound.

One or more of the layers 524, 526, 528, 530, 532 may be applied from a roll of material, printed, sprayed, or otherwise deposited to integrate the battery cell 510 with the circuit board 500. In one embodiment, for example, the second metal layer 514 is attached to a partially completed structure including foam layers within which anode, cathode, and/or separator have already been deposited. The height, width, and/or length of the battery cell 510 may be adjusted to fit a selected portion of the second metal layer 514 and/or to adjust the energy storage capacity of the battery cell 510.

Figure 5B:
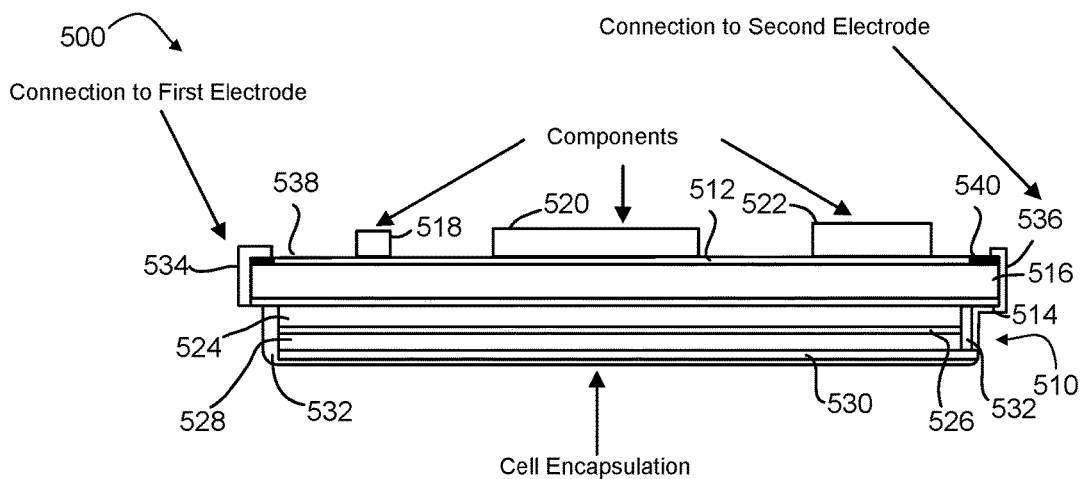

The circuit board 500 includes a first electrical connection 534 between at least a first circuit trace 538 on the first metal layer 512 to the first electrode (i.e., the second metal layer 514), and a second electrical connection 536 between at least a second circuit trace 540 on the first metal layer 512 and the second electrode 530. As shown in FIG. 5A, the first electrical connection 534 and the second electrical connection 536 may pass through the non-conductive substrate 516 (such as plated vias). Note that although the second electrical connection 536 is shown passing through the second metal layer 514, the second electrical connection 536 is isolated from the second metal layer 514 so as to only provide an electrical connection from one or more traces on the first metal layer 512 to the second electrode 530. In other embodiments, such as shown in FIG. 5B, one or both of the first electrical connection 534 and the second electrical connection 536 pass around the edges of the non-conductive substrate 516 of the circuit board 500. Other configurations may be used in other embodiments. For example, the cell in other embodiments may be symmetrical with a center electrode and connections to top and bottom current collectors (see FIG. 6).

In one embodiment, the second metal layer 514 is configured as a negative battery terminal or anode current collector of the battery cell 510. In such embodiments, the first solid electrolyte layer 524 comprises a solid electrolyte anode material, the second solid electrolyte layer 528 comprises a solid electrolyte cathode material, and the second electrode 530 is configured as a positive battery terminal or cathode current collector of the battery cell 510.

In another embodiment, the second metal layer 514 is configured as a positive battery terminal or cathode current collector of the battery cell 510. In such embodiments, the first solid electrolyte layer 524 comprises a solid electrolyte cathode material, the second solid electrolyte layer 528 comprises a solid electrolyte anode material, and the second electrode 530 is configured as a negative battery terminal or anode current collector of the battery cell 510.

The battery cell 510 shown in FIGS. 5A and 5B may be integrated with the circuit board during the manufacturing process. In other words, certain embodiments provide a device including the circuit board 500 (e.g., the first metal layer 512, the non-conductive substrate 516, and the second metal layer 514) with the batter cell 510 integrated thereon. A user may then etch or otherwise form circuit traces in the first metal layer 512 and attach the circuit components 518, 520, 522 thereto (e.g., using automated techniques such as pick-and-place machines and/or reflow soldering). The solid polymer or ceramic material of the first solid electrolyte layer 524 and the second solid electrolyte layer 528 are configured to withstand the high temperatures and other harsh conditions of forming the circuit traces and attaching the circuit components 518, 520, 522 thereto. Further, the integrated battery cell 510 increases safety during use and reduces manual labor and overall cost, as compared to using cells with liquid electrolytes.

Figure 6:
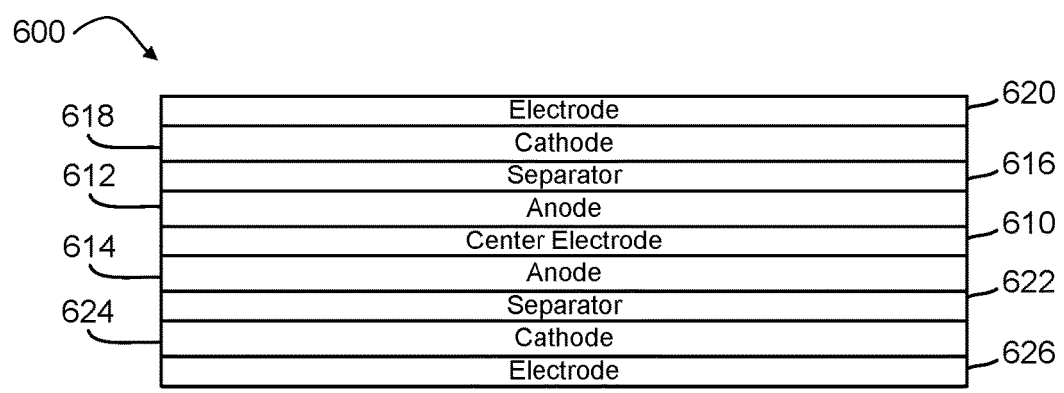
FIG. 6 is a cross-sectional side view of a battery cell according to one embodiment.

FIG. 6 is a cross-sectional side view of a battery cell 600 according to one embodiment. In this example, the battery cell 600 is symmetrical with a center electrode 610, a first solid electrolyte anode 612 above the center electrode 610, and a second solid electrolyte anode 614 below the center electrode 610. Accordingly, in this example, the center electrode 610 comprises an anode current collector. Those skilled in the art will recognize from the disclosure herein that in other embodiments, the center electrode 610 may be a cathode current collector.

Above the first solid electrolyte anode 612 is a first separator 616, a first separator 616, a first solid electrolyte cathode 618, and a top electrode 620. Similarly, below the second solid electrolyte anode 614 is a second separator 622, a second solid electrolyte cathode 624, and a bottom electrode 626. Thus, in this example, the top electrode 620 and the bottom electrode 626 are symmetric cathode current collectors.

One or more of the center electrode 610, top electrode 620, and bottom electrode 626 may be integrated with an electronic device. For example, the center electrode 610, or one of the top electrode 620 or bottom electrode 626, may comprise the back plate 414 shown in FIGS. 4B, 4C, and 4D. When the center electrode 610 comprises the back plate 414, the battery cell 600 may be formed on both sides of the back plate 414. As another example, the top electrode 620 may comprise the second metal layer 514 of the circuit board 500 shown in FIGS. 5A and 5B. In such an embodiment, the bottom electrode may be coupled to or integrated with a second electronic device (e.g., a second circuit board).

Figure 7:
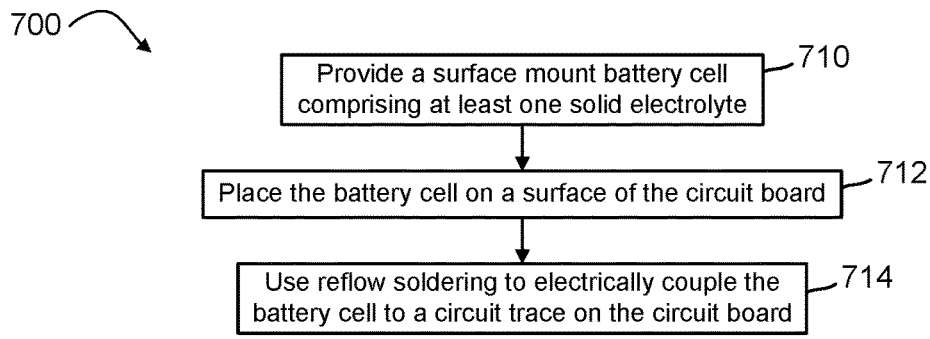
FIG. 7 is flow chart of a method for manufacturing a circuit board according to one embodiment.

FIG. 7 is flow chart of a method 700 for manufacturing a circuit board according to one embodiment. The method 700 includes providing 710 a surface mount battery cell comprising at least one solid electrolyte, placing 712 the battery cell on a surface of the circuit board, and using 714 a reflow soldering process to electrically couple the battery cell to circuit trace on the circuit board.

Figure 8:
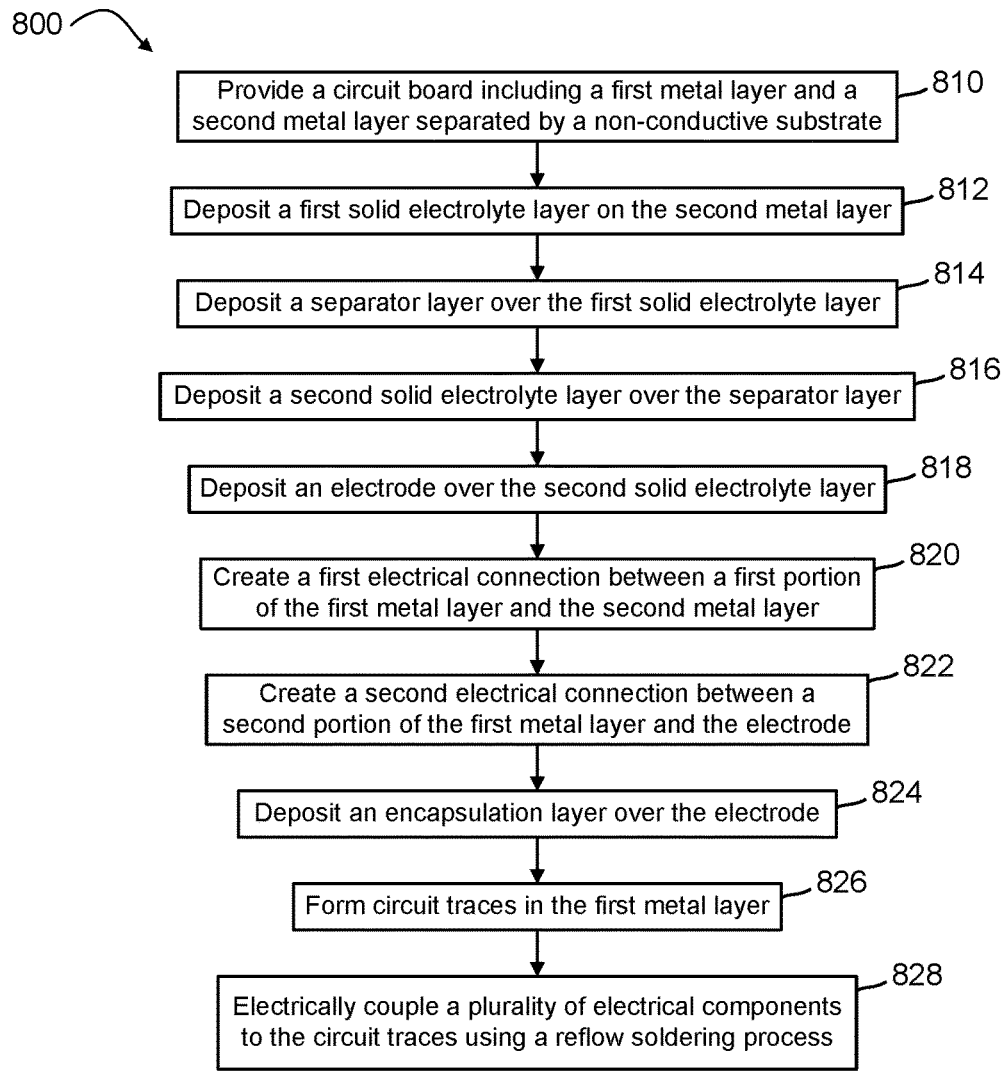
FIG. 8 is a flow chart of a method for manufacturing a circuit board according to another embodiment.

FIG. 8 is a flow chart of a method 800 for manufacturing a circuit board according to another embodiment. The method 800 includes providing 810 a circuit board including a first metal layer and a second metal layer separated by a non-conductive substrate, depositing 812 a first solid electrolyte layer on the second metal layer, depositing 814 a separator layer over the first solid electrolyte layer, depositing 816 a second solid electrolyte layer over the separator layer, and depositing 818 an electrode over the second solid electrolyte layer. The method 800 further includes creating 820 a first electrical connection between a first portion of the first metal layer and the second metal layer, and creating 822 a second electrical connection between a second portion of the first metal layer and the electrode. In certain embodiments, the method 800 may also include depositing 824 an encapsulation layer over the electrode. In addition, or in other embodiments, the method 800 may include forming 826 circuit traces in the first metal layer, and electrically coupling 828 a plurality of electrical components to the circuit traces using a reflow soldering process.

EXAMPLE EMBODIMENTS

The following are examples of further embodiments. Examples may include subject matter such as a method, means for perming acts of the method, at least one machine-readable medium including instructions that, when performed by a machine cause the machine to perform acts of the method, or of an apparatus or system for rendering augmented video according to the embodiments and examples described herein.

Example 1 is a device comprising a double sided circuit board including a first metal layer and a second metal layer separated by a non-conductive substrate, and a battery cell integrated with the double sided circuit board. The battery cell includes a first electrode comprising the second metal layer of the double sided circuit board, a first solid electrolyte layer adjacent to the second metal layer, a separator layer adjacent to the first solid electrolyte layer, a second solid electrolyte layer adjacent to the separator layer, and a second electrode adjacent to the second solid electrolyte layer.

Example 2 includes the subject matter of Example 1, wherein at least one of the first solid electrolyte layer and the second solid electrolyte layer comprises a solid polymer or ceramic material.

Example 3 includes the subject matter of any of Examples 1-2, wherein the separator comprises a solid polymer or ceramic material configured to prevent electrical short circuits between the first solid electrolyte layer and the second solid electrolyte layer, and to allow for transport of electronic charge carriers between the first solid electrolyte layer and the second solid electrolyte layer during passage of current from the first electrode to the second electrode in the battery cell.

Example 4 includes the subject matter of any of Examples 1-3, wherein first electrode comprises a negative electrode and the second electrode comprises a positive electrode of the battery cell, and wherein the first solid electrolyte layer comprises a solid anode electrolyte material and the second solid electrolyte layer comprises a solid cathode electrolyte material.

Example 5 includes the subject matter of any of Examples 1-3, wherein first electrode comprises a positive electrode and the second electrode comprises a negative electrode of the battery cell, and wherein the first solid electrolyte layer comprises a solid cathode electrolyte material and the second solid electrolyte layer comprises a solid anode electrolyte material.

Example 6 includes the subject matter of any of Examples 1-5, wherein the first metal layer and the second metal layer comprise copper.

Example 7 includes the subject matter of any of Examples 1-6, wherein the first metal layer comprises circuit traces.

Example 8 includes the subject matter of Example 7, and further includes a plurality of circuit components electrically coupled to the circuit traces.

Example 9 includes the subject matter of Example 7, and further includes a first electrical connection coupling a first trace of the first metal layer to the first electrode, and a second electrical connection coupling a second trace of the first metal layer to the second electrode.

Example 10 includes the subject matter of Example 9, wherein at least one of the first electrical connection and the second electrical connection comprises an electrically conductive via through the non-conductive substrate of the double sided circuit board.

Example 11 includes the subject matter of Example 9, wherein at least one of the first electrical connection and the second electrical connection pass around an outside edge of the non-conductive substrate of the double sided circuit board.

Example 12 includes the subject matter of any of Examples 1-11, further comprising an encapsulation layer at least partially enclosing the battery cell.

Example 13 is a mobile electronic device that includes a chassis comprising an electrically conductive surface, one or more electrical components on or within the chassis, and a solid electrolyte battery integrated with the chassis and configured to provide electrical current to the one or more electrical components. The solid electrolyte battery includes a first electrode comprising the electrically conductive surface of the chassis, a first solid electrolyte layer overlying the electrically conductive surface of the chassis, a separator layer overlying the first solid electrolyte layer, a second solid electrolyte layer overlying the separator layer, and a second electrode overlying the second solid electrolyte layer.

Example 14 includes the subject matter of Example 13, wherein at least one of the first solid electrolyte layer and the second solid electrolyte layer comprises a solid polymer or ceramic material.

Example 15 includes the subject matter of any of Examples 13-14, wherein the separator comprises a solid polymer or ceramic material configured to prevent electrical short circuits between the first solid electrolyte layer and the second solid electrolyte layer, and to allow for transport of electronic charge carriers between the first solid electrolyte layer and the second solid electrolyte layer during passage of current from the first electrode to the second electrode in the solid electrolyte battery.

Example 16 includes the subject matter of any of Examples 13-15, further comprising an encapsulation layer at least partially enclosing the solid electrolyte battery.

Example 17 is a method for manufacturing a circuit board. The method includes providing a battery cell comprising at least one solid electrolyte, a positive electrode, and a negative electrode. The positive electrode and negative electrode are configured for surface mounting. The method also includes placing the battery cell on a surface of the circuit board, and electrically coupling, using a reflow soldering process, the positive electrode to a first electrically conductive trace and the negative electrode to a second electrically conductive trace on the surface of the circuit board.

Example 18 includes the subject matter of Example 17, wherein the at least one solid electrolyte comprises a solid anode electrolyte material and a solid cathode electrolyte material.

Example 19 is a method for manufacturing a circuit board including a first metal layer and a second metal layer separated by a non-conductive substrate. The method includes depositing a first solid electrolyte layer on the second metal layer, depositing a separator layer over the first solid electrolyte layer, depositing a second solid electrolyte layer over the separator layer, and depositing an electrode over the second solid electrolyte layer.

Example 20 includes the subject matter of Example 19, wherein the method further includes creating a first electrical connection between a first portion of the first metal layer and the second metal layer, and creating a second electrical connection between a second portion of the first metal layer and the electrode.

Example 21 includes the subject matter of any of Examples 19-20, wherein the method further includes depositing an encapsulation layer over the electrode.

Example 22 includes the subject matter of any of Examples 19-21, wherein the method further includes forming circuit traces in the first metal layer, and electrically coupling a plurality of electrical components to the circuit traces using a reflow soldering process.

Example 23 is machine-readable storage including machine-readable instructions, when executed, to implement a method as claimed in any of Examples 17-22.

Example 24 is a system for processing a circuit board including a first metal layer and a second metal layer separated by a non-conductive substrate. The system includes means for depositing a first solid electrolyte layer on the second metal layer, means for depositing a separator layer over the first solid electrolyte layer, means for depositing a second solid electrolyte layer over the separator layer, and means for depositing an electrode over the second solid electrolyte layer.

Example 25 includes the subject matter of Example 24, and further includes means for creating a first electrical connection between a first portion of the first metal layer and the second metal layer, and means for creating a second electrical connection between a second portion of the first metal layer and the electrode.

Example 26 includes the subject matter of any of Examples 24-25, and further includes means for depositing an encapsulation layer over the electrode.

Example 27 includes the subject matter of any of Examples 24-26, and further includes means for forming circuit traces in the first metal layer, and means for electrically coupling a plurality of electrical components to the circuit traces using a reflow soldering process.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. might be used herein only to facilitate discussion, and carry no particular temporal or chronological significance unless otherwise indicated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Various embodiments may be implemented using hardware elements, software elements, and/or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. The scope of the present invention should, therefore, be determined only by the following claims.

The invention claimed is:

1. A device comprising:
a double sided circuit board including a first metal layer and a second metal layer separated by a non-conductive substrate, wherein the first metal layer comprises circuit traces, and the second metal layer comprises a conductive ground plane; and
a battery cell integrated with the double sided circuit board, the battery cell including:
 a first solid electrolyte layer abutting the conductive ground plane of the second metal layer, wherein the second metal layer is a first electrode of the battery cell;
 a separator layer adjacent to the first solid electrolyte layer;
 a second solid electrolyte layer adjacent to the separator layer; and
 a second electrode adjacent to the second solid electrolyte layer; and
 an encapsulation layer partially enclosing the battery cell, wherein an edge of the second electrode remains exposed.

2. The device of claim 1, wherein at least one of the first solid electrolyte layer and the second solid electrolyte layer comprises a solid polymer or ceramic material.

3. The device of claim 1, wherein the separator comprises a solid polymer or ceramic material configured to prevent electrical short circuits between the first solid electrolyte layer and the second solid electrolyte layer, and to allow for transport of electronic charge carriers between the first solid electrolyte layer and the second solid electrolyte layer during passage of current from the first electrode to the second electrode in the battery cell.

4. The device of claim 1, wherein the first electrode is a negative electrode and the second electrode is a positive electrode of the battery cell, and wherein the first solid electrolyte layer comprises a solid anode electrolyte material and the second solid electrolyte layer comprises a solid cathode electrolyte material.

5. The device of claim 1, wherein the first electrode is a positive electrode and the second electrode is a negative electrode of the battery cell, and wherein the first solid electrolyte layer comprises a solid cathode electrolyte material and the second solid electrolyte layer comprises a solid anode electrolyte material.

6. The device of claim 1, wherein the first metal layer and the second metal layer comprise copper.

7. The device of claim 1, further comprising a plurality of circuit components electrically coupled to the circuit traces.

8. The device of claim 1, further comprising:
a first electrical connection coupling a first trace of the first metal layer to the first electrode; and
a second electrical connection coupling a second trace of the first metal layer to the exposed edge of the second electrode.

9. The device of claim 8, wherein at least one of the first electrical connection and the second electrical connection comprises an electrically conductive via through the non-conductive substrate of the double sided circuit board.

10. The device of claim 8, wherein at least one of the first electrical connection and the second electrical connection pass around an outside edge of the non-conductive substrate of the double sided circuit board.

11. The device of claim 1, further comprising an encapsulation layer at least partially enclosing the battery cell.

* * * * *